United States Patent
Mizusaki et al.

(10) Patent No.: US 7,345,141 B2
(45) Date of Patent: Mar. 18, 2008

(54) POLYMER MATERIAL HAVING CARRIER TRANSPORT PROPERTY, AND ORGANIC THIN FILM ELEMENT, ELECTRONIC DEVICE, AND CONDUCTOR LINE WHICH USE SAME

(75) Inventors: Masanobu Mizusaki, Nara (JP); Motohiro Yamahara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 88 days.

(21) Appl. No.: 10/496,273

(22) PCT Filed: Nov. 15, 2002

(86) PCT No.: PCT/JP02/11978

§ 371 (c)(1),
(2), (4) Date: Jan. 27, 2005

(87) PCT Pub. No.: WO03/044878

PCT Pub. Date: May 30, 2003

(65) Prior Publication Data

US 2006/0217492 A1    Sep. 28, 2006

(30) Foreign Application Priority Data

Nov. 22, 2001 (JP) ............................ 2001-358552
Oct. 11, 2002 (JP) ............................ 2002-299662

(51) Int. Cl.
*C08F 6/06* (2006.01)
*C08J 3/07* (2006.01)
*C08J 3/24* (2006.01)

(52) U.S. Cl. ..................... 528/503; 430/72; 430/73; 428/690; 428/917; 564/305; 564/307

(58) Field of Classification Search ................ 430/73, 430/72; 564/307, 305; 428/690, 917; 528/503
See application file for complete search history.

(56) References Cited

FOREIGN PATENT DOCUMENTS

| EP | 1 006 169 A1 | 12/1995 |
|---|---|---|
| JP | 07-235378 | 9/1995 |
| JP | 10-012377 | 1/1998 |
| JP | 10-156967 | 6/1998 |
| JP | 11-040358 | 2/1999 |
| JP | 11-054270 | 2/1999 |
| JP | 2000-323276 | 11/2000 |
| WO | WO 96/20253 | 7/1996 |

OTHER PUBLICATIONS

Carter et al., "Operating Stability of Light-emitting polymer diodes based on poly(p-phenylene vinylene)," *Appl. Phys. Lett.* 71(1)34-36 (1997).
McCullough et al., "The Chemistry of Conducting Polythiophenes," *Advanced Materials* 10(2):93-116 (1998).
Roth et al., "Conductive Polymers in Molecular Electronics: Conductivity and photoconductivity," *Science and Applications of Conducting Polymers* 129-139 (1991).
Tang et al., "Organic electroluminescent diodes," *Appl. Phys. Lett.* 51(12)913-915 (1987).

*Primary Examiner*—Duc Truong
(74) *Attorney, Agent, or Firm*—Edwards Angell Palmer & Dodge, LLP; David G. Conlin; Mark D. Russett

(57) ABSTRACT

The present invention provides a polymer material having a carrier transport property. The polymer material has first and second states in which degrees of the carrier transport property are different from each other, microscopic structures in the first and second states are different from each other, and one of the first and second states can be changed into the other state.

17 Claims, 10 Drawing Sheets

Crosslink state        Crosslink dissociation state

FIG. 3
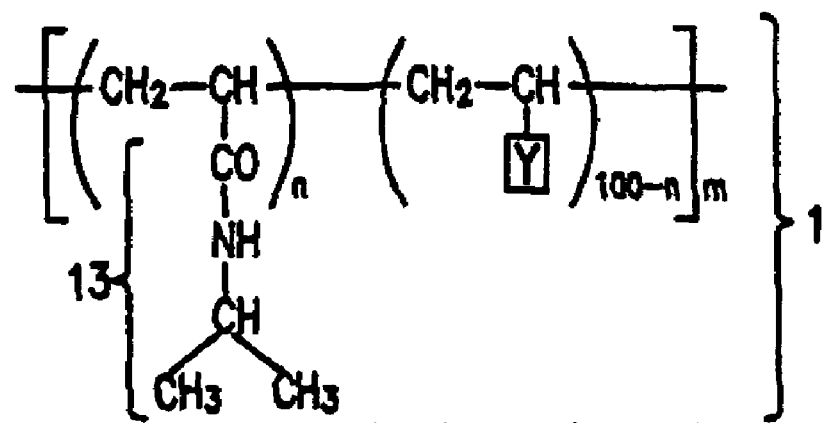
Y: Luminescent agent, doping agent, electron transport agent, or hole transport agent
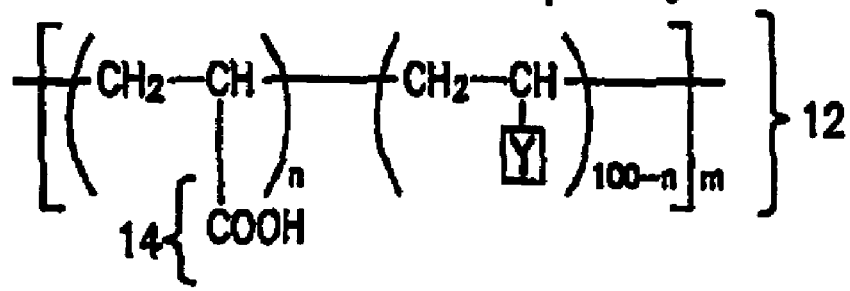
FIG. 4
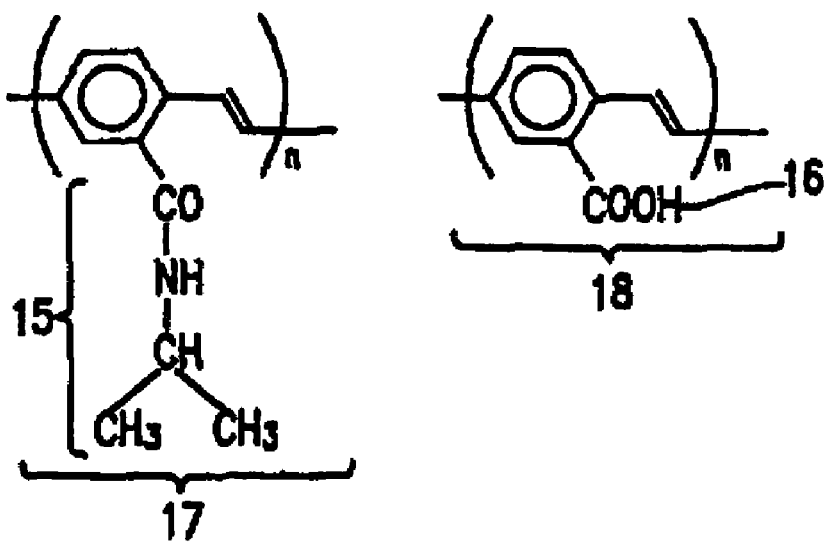

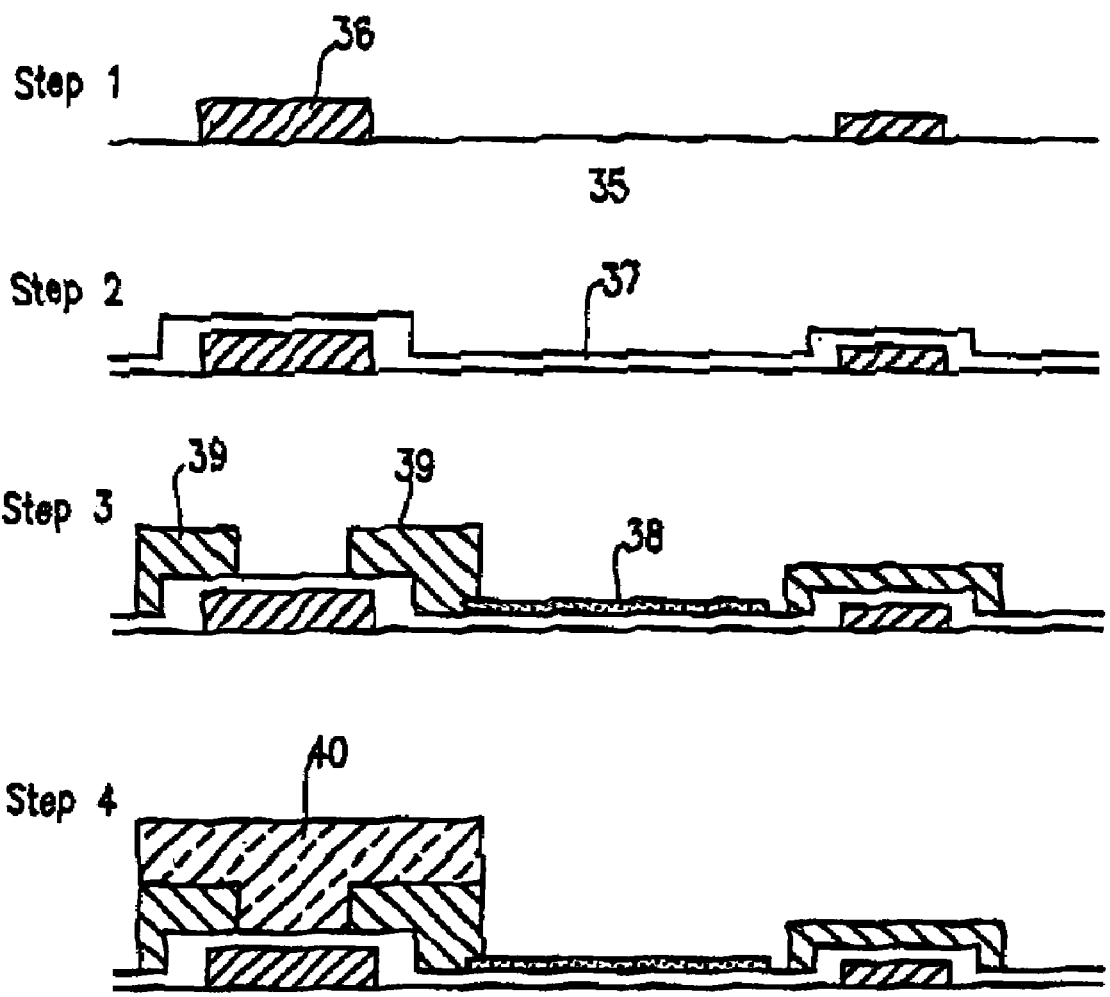

POLYMER MATERIAL HAVING CARRIER TRANSPORT PROPERTY, AND ORGANIC THIN FILM ELEMENT, ELECTRONIC DEVICE, AND CONDUCTOR LINE WHICH USE SAME

TECHNICAL FIELD

The present invention relates to a polymer material having a carrier transport property, and more particularly to a polymer material useful as a luminescent material and a transport material (e.g., an electron transport material, a hole transport material, etc.) for use in an organic electroluminescent (EL) element which can be used for a display section, etc., of an information apparatus, such an a computer, or an electronics product, such as a television. The present invention also relates to an organic thin film element, an electronic device, and a conductor line, which use such a material.

BACKGROUND ART

In recent years, organic materials have been replacing conventional inorganic materials in various situations in the field of electronics. Among the organic materials, in particular, a polymer material has advantages of ease of handling, safety, etc., over a low molecular material. Moreover, industry expects much from the polymer material since physical properties of the polymer material can be controlled relatively easily at a low cost using a technique such as copolymerization, polymer blending, or the like.

When the polymer material is used in the field of electronics, an amorphous property, a carrier transport property, etc., are required as important physical properties of the material. If the polymer material can stably have such physical properties, the polymer material can be a satisfactory material in the field of electronics, which can stand comparison with the conventional inorganic material in terms of performance thereof, while making the most use of its advantage. In order to develop the polymer material having such considerable possibilities in the field of electronics, a variety of research and development have been conducted in every aspect of the field.

As an example, in recent years, research and development of a next generation luminescent-type display, which replaces a cathode-ray tube (CRT) and a liquid crystal display (CRT), have been eagerly conducted. Moreover, research and development of a luminescent material and a transport material, which are used in a display element of the next generation luminescent-type display, have been also eagerly conducted.

Examples of the next generation luminescent-type display include a plasma display panel (PDP), a field emission display (FED), an organic electroluminescent display (organic ELD), etc. Among these displays research and development of a luminescent material and a transport material for the organic ELD are conducted with respect to various materials including a polymer material or a low molecular weight material. Moreover, research and development of display elements using these materials also have been eagerly conducted and some of such display elements have been coming into practical use.

A prior art document related to production of an organic ELD display element discloses a process for forming organic thin film layers, such as a luminescent layer, an electron transport layer, a hole transport layer, etc., (for example, see Non-Patent Document 1: "Applied Physics Letters", Sep. 21, 1987, Vol. 51, No. 12, p. 913). According to the formation process disclosed in Non-Patent Document 1, a low molecular weight material is used as a raw material to form a film using a vacuum deposition method. Moreover, in Non-Patent Document 1, in order to color the thin film formed of the low molecular weight material, luminescent materials having different luminescent colors are deposited at corresponding pixel portions on the low molecular weight thin film via a mask having a prescribed pattern.

On the other hand, another prior art document discloses a process for forming an organic thin film layer using a polymer material (for example, see Non-Patent Document 2: "Applied Physics Letters", Jul. 7, 1997, Vol. 71, No. 1, p. 34). According to the formation process disclosed in Non-Patent Document 2, a polymer solution is applied on a substrate, and then a solvent in removed from the polymer solution so as to form an organic thin film. Representative examples of a method for applying a polymer solution to a substrate include a spincoating method and an inkjet method.

Further, prior art documents disclose, as a display element of an organic ELD, means for coloring an organic EL element in which a polymer material in used (for example, see Patent Document 1: Japanese Laid-Open Patent Publication No. 7-235376, Patent Document 2: Japanese Laid-Open Patent Publication No. 10-12377, Patent Document 3: Japanese Laid-Open Patent Publication No. 10-153967, Patent Document 4: Japanese Laid-Open Patent Publication No. 11-40358, Patent Document 5: Japanese Laid-Open Patent Publication No. 11-54270, and Patent Document 6: Japanese Laid-Open Patent Publication No. 2000-323276). In these patent documents, an inkjet method, which enables patterning, is used for forming an organic thin film layer.

In the production of an organic thin film element, properties required for thin films included in the organic thin film element include stable luminescent brightness and efficiency, a long-term luminescent life, satisfactory transparency, uniformity, and luminescent stability, etc. In order to obtain theme properties, it is necessary to uniformly disperse or dissolve a luminescent material and a transport material in an amorphous thin film.

Conventionally, the low molecular weight material, which has been mainly used as a raw material of an organic thin film element, is in an amorphous state immediately after the formation of a thin film, and thus the organic thin film element has satisfactory transparency, uniformity and luminescent stability in an early stage of its use. However, such properties cannot last for a long period of time, and therefore the low molecular weight material has practical problems.

Further, in order to produce a thin film for use in an organic thin film element using a low molecular weight material, as conducted in the above-described Non-Patent Document 1, it in necessary to use a vacuum deposition method. However, there is a problem in that it is difficult to produce a large-sized display using the vacuum deposition method.

On the other hand, when the polymer material is used as a raw material of an organic thin film element, the polymer material can be easily brought into a stable amorphous state, and therefore there in an advantage that long-term and stable luminescence can be achieved as compared to the case where the low molecular weight material is used. Moreover, an a method for forming an organic thin film, a relatively easy method in which a polymer solution including a polymer material dissolved in a solvent is applied on a substrate can be employed. Such a method has an advantage of being easily applied to the production of a large-sized display. However, when the polymer material is used as a raw material of the organic thin film element, there is a considerable problem to be solved in that it is difficult to produce a high-quality thin film, that is, a thin film having a uniform thickness and no defects.

Further, an another example of using an organic material in the field of electronics, there in a design for producing an electronic device and conductor lines using the organic polymer material. An one of such cases, in recent years, an organic transistor element including an electrode material, an insulating layer, and a semiconductor layer, which are all produced using the organic polymer material, has been realized an the advance of an inkjet method (for example, see Non-Patent Document 3: Shimoda and Kawase, "Applied Physics", 2001, Vol. 70, No. 12). In such an organic transistor element, particularly, an organic electrode material including an organic polymer material in required to have a carrier transport property (an electroconductive property and a hole transport property). The degree of the carrier transport property depends on an orientational property of the material, and it is known that as the orientational property of a material increased, the carrier transport property of the material in also increased. In a conventional organic transistor element, PEDOT-PSS, which is generally obtained by adding a polystyrene sulfonate (PSS) to polyethylene dioxythiophene (PEDOT) as a dopant, is used as an organic electrode material. However, PEDOT has a poor orientational property in an electrode and cannot express a sufficient carrier transport property as an electrode material.

Furthermore, in order to increase carrier mobility in an organic semiconductor layer of the organic transistor element, attempts to increase an orientational property of the organic semiconductor layer have been conducted. Specifically, a polymer material such an polyimide or the like is used as a material for an insulating layer, a rubbing treatment is performed on the insulating layer, and an organic semiconductor layer is formed further thereon, so am to increase the orientational property of the organic semiconductor layer. The rubbing treatment can increase the orientational property of the organic semiconductor layer to some degree but the increase in the orientational property is still not recognized an being at a sufficient level. Therefore, the problem that the carrier transport property of the organic electrode material is insufficient is still left unsolved.

As described above, various attempts to apply the organic material to the field of electronics have been conventionally conducted but problems as described below still have been left unsolved up to now.

It is essential for the organic material for use in the field of electronics to have physical properties, ouch as a carrier transport property, an amorphous property, etc., an described above. However, an organic material, which can stably maintain such physical properties and can be easily handled, has not been available yet. When the conventional organic material is used for producing an electronics product, it is not possible to prevent the performance of the electronics product from being deteriorated.

To explain it more specifically, for example, the low molecular weight material, which is mainly used in the conventional organic thin film element and a method for producing such an element, cannot achieve long-term and stable luminescence. The reason for this is that when an organic thin film is formed using a low molecular weight material, the low molecular weight material is gradually crystallized over a lapse of time, thereby causing the physical properties, such as transparency and the like, of that thin film to be nonuniform. Moreover, when a polymer material is used for a luminescent layer and a transport layer of the organic thin film element, long-term and stable luminescence can be achieved as compared to the case where a low molecular weight material is used. However, it in very difficult to form a thin film having a uniform thickness and no defects using a conventional production method. The reason for this is that in the case of the polymer material, the viscosity of a solution of that material becomes larger as the molecular weight of the material becomes greater, which makes it difficult to apply the solution on a substrate using a spincoating method, an inkjet method, or the like.

The present invention is provided in view of the above-described problems and an objective thereof is to provide a polymer material having a carrier transport property which allows the formation of a thin film on the scale of several tons of nanometers, which has a superior amorphous property while having a uniform thickness and no defeats and can be used for an organic EL element and the like. Another objective of the present invention is to provide a method for producing an organic thin film element using such a polymer material.

When an organic polymer material on which a heat treatment, a rubbing treatment, etc., are performed is applied to an electronic device and conductor lines, the oriental property of the material can be improved, thereby, increasing a carrier transport property, which is one of the properties essential to the use as the electronic product and conductor lines, to some degree. However, merely performing a rubbing treatment or the like does not necessarily provide the polymer material with a sufficient orientational property. As a result, the polymer material in not provided with a sufficient carrier transport property. Moreover, it is difficult for the conventional organic polymer material to maintain its orientational property for a long period of time, and therefore there in a disadvantage that a life of an electronics product using the organic polymer material is short.

The present invention is also provided in view of such problems, and objectives of the present invention are to provide an electronic device and conductor lines which use an organic polymer material having a considerable orientational property, and thus having a considerable carrier transport property, and capable of maintaining its performance for a long period of time.

DISCLOSURE OF THE INVENTION

According to one aspect of the present invention, there is provided a polymer material having a carrier transport property, the polymer material having first and second states in which degrees of the carrier transport property are different from each other, microscopic structures in the first and second states being different from each other, and one of the first and second states capable of being changed into the other state, thereby achieving the above objective.

In one embodiment of this invention, the change in reversible.

In one embodiment of this invention, the change occurs depending on an external energy.

In one embodiment of this invention, the external energy is heat or light.

In one embodiment of this invention, the polymer material includes at least one type of a crosslinkable functional group, in the first state, the crosslinkable functional group being in a crosslink dissociation state, and in the second state, the crosslinkable functional group being in a crosslink state.

In one embodiment of thin invention, the crosslinkable functional group is an amide group, a carboxyl group, a hydroxyl group, an amino group, a halogen-containing group, a base-containing group, or an aromatic polyfunctional compound or a complex compound thereof or a derivative-containing group thereof.

In one embodiment of this invention, the carrier transport property is expressed by introduction of a pendant.

In one embodiment of this invention, the carrier transport property is expressed by introduction of a π-conjugated structure In one embodiment of this invention, the polymer material includes one or more types of polymer compounds.

According to another aspect of the present invention, there in provided an organic thin film element including the above-described polymer material, thereby achieving the above objective.

According to still another aspect of the present invention, there is provided a method for producing an organic thin film element using the above-described polymer material, the method including the steps of: dissolving the polymer material in a solvent so as to prepare a solution; adjusting an external energy so as to bring the polymer material in the solution into a crosslink dissociation state; applying the solution, which includes the polymer material in the crosslink dissociation state, on a substrate; burning a substrate on which the solution is applied so as to form an organic thin film; and adjusting the external energy so as to change the polymer material included in the organic thin film from the crosslink dissociation state to a crosslink state, thereby achieving the above objective.

In one embodiment of this invention, the change from one of the crosslink state and the crosslink dissociation state to the other state is reversible.

In one embodiment of this invention, the external energy is heat or light.

In one embodiment of this invention, the crosslinkable functional group is an amide group, a carboxyl group, a hydroxyl group, an amino group, a halogen-containing group, a base-containing group, or an aromatic polyfunctional compound or a complex compound thereof or a derivative-containing group thereof.

In one embodiment of this invention, the carrier transport property is expressed by introducing a pendant into the polymer material.

In one embodiment of this invention, the carrier transport property is expressed by introducing a π-conjugated structure into the polymer material.

In one embodiment of this invention, the polymer material comprises one or more types of polymer compounds.

According to still another aspect of the present invention, there is provided an electronic device element including a polymer material according to claim 5, thereby achieving the above objective.

According to still another aspect of the present invention, there is provided a conductor line including a polymer material of claim 5.

BRIEF DESCRIPTION OF THE DRAWINGS

FIG. 3 is a diagram illustrating a polymer compound having a crosslinkable functional group and a luminescent agent or an electrical charge transport agent introduced as a pendant.

FIG. 4 is a diagram illustrating a polymer compound having a crosslinkable functional group and a main chain having a π-conjugated structure.

FIG. 8 is a diagram illustrating the steps of producing an organic TFT element array using a polymer material having a carrier transport property of the present invention.

BEST MODE FOR CARRYING OUT THE INVENTION

Hereinafter, examples of a polymer material having a carrier transport property according to the present invention, and an organic thin film element, an electronic device and conductor lines, which use ouch a polymer material, will be sequentially described with reference to the drawings.

Note that the wording "degrees of a carrier transport property" described herein is related to, for example, the life and brightness of a luminescent element, carrier mobility or an electroconductive property in a transistor or a conductor line, conversion efficiency of a solar cell, etc., and the wording "the degrees of a carrier transport property are different" refers to, for example, difference in life or brightness of a luminescent device according to microstructures, difference in carrier mobility or electroconductive property of a transistor or a conductor line, and difference in conversion efficiency of a solar cell.

Figure 1A:
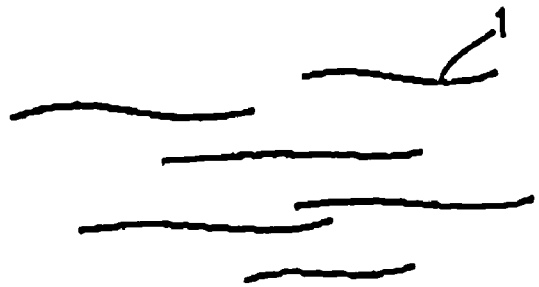
FIG. 1*a* in a schematic diagram illustrating a polymer compound included in a polymer material, which has been used in a conventional organic thin film element.

A polymer compound used in a conventional organic thin film element ban a molecular structure in which a polymer chain in linear. This is schematically shown in FIG. 1a. As can be seen from FIG. 1a, among linear polymer compounds 1, there is no chemical bonding or interaction between molecular chains. Accordingly, in such a linear polymer compound, the length of a molecular chain determines the molecular weight of a polymer compound having that molecular chain, thereby determining physical properties of a polymer material including the polymer compound.

In order to control the physical properties of the polymer material, it is important to control the microscopic structure of the polymer material. Note that the term microscopic structures described herein refers to a molecular structure, a crystal structure, a phase structure, etc., of the polymer material. Such a microscopic structure has a size in the range between the order of nanometers and the order of micrometer. Examples of the physical properties, which are essential to the polymer material used in an organic thin film element, include a carrier transport property, an amorphous property, etc. Among much properties, in particular, the carrier transport property directly affects the performance as an electrode or a semiconductor, and therefore is extremely important and essential. The polymer material having a stable carrier transport property can be preferably used as an electronics material.

In the case where a polymer material is provided with a carrier transport property, the degree of the carrier transport property can vary depending on the state of the microscopic structure of the polymer material. In order to explain this, a polymer material having two states (first and second states) in considered. This polymer material has different microscopic structures in the first and second states. This affects the degree of the carrier transport property of the polymer material. For example, in the first state (crosslink state), polymers are crosslinked to each other and the carrier transport property of the polymer material is considerable. In the second state (crosslink dissociation state), polymers are not crosslinked and the carrier transport property is not considerable. In this example, the polymer material in crosslinked or dissociated at a molecular level, whereby it is possible to control the degree of the a carrier transport property. Accordingly, if the microscopic structure of the polymer material having a carrier transport property can be freely controlled and easily handled, the use of the polymer material can be widened as a useful electronics material. In addition to the above-described crosslink state-crosslink dissociation state relationship, examples of the first state-second state relationship of the polymer material include a crystal state-amorphous state relationship, an oriented state-unoriented state relationship, a sol state-gal state relationship, etc. The essential condition for changing the degree of the carrier transport property of the polymer material is that the microscopic structure of the polymer material can have two states different from each other.

In order to promote a better understanding of the present invention, more detailed description of the present invention will be provided taking an example of a polymer material, which has a carrier transport property having different degrees due to the crosslink state (first state)-crosslink dissociation state (second state) relationship. Note that in the present invention, the crosslink state (first state) and the crosslink dissociation state (second state) can be changed from one state to another state and such a change may be reversible. The term "crosslink state" described heroin refers to a chemical bonding state, i.e., side chains or terminuses of a polymer are chemically bonded to each other, a non-shared chemical bonding state, a state where at least one or more sites contribute association of polymers, or the like. The term "crosslink dissociation state" described herein refers to a state where bonding or association in not provided between side chains or terminuses of a polymer.

Figure 1B:
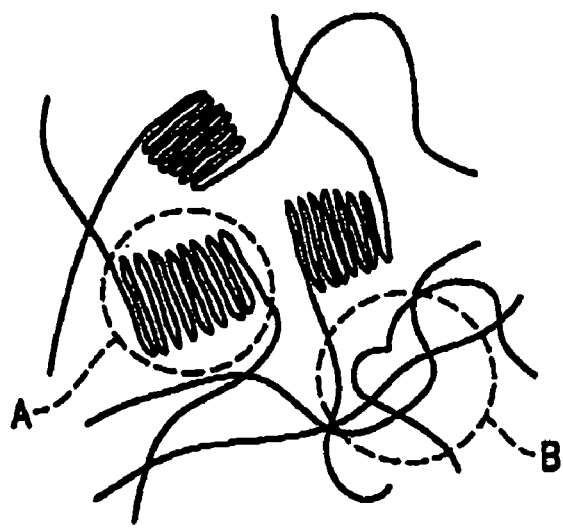
FIG. 1*b* is a schematic diagram illustrating a crystal region and an amorphous (noncrystal) region of a polymer material.

In general, a polymer material has a crystal region and an amorphous (noncrystal) region. FIG. 1b is a diagram schematically illustrating a crystal region and an amorphous region of a polymer material. The crystal region is a region where molecular chains of a polymer compound included in a polymer material are regularly arranged (e.g., the region indicated by A shown in FIG. 1b). The amorphous region is a region where molecular chains of the polymer compound are randomly arranged (e.g., the region indicated by B shown in FIG. 1b). The ratio of the crystal region to the amorphous region varies according to a variation of the molecular weight of the polymer compound. In general, an the length of a molecular chain of the polymer compound becomes longer (i.e., the molecular weight becomes greater), the amorphous region is increased. The increase in area of the amorphous region means the decrease of crystallinity (the degree of crystallization) of the polymer material. Accordingly, by increasing the molecular weight of the polymer compound, it is possible to obtain a polymer material having a satisfactory amorphous property and high transparency which in suitable for an organic thin film element.

However, when the molecular weight of the polymer compound is increased, as described above, the viscosity of the polymer solution for use in application on a substrate is increased, thereby causing difficulty in production of a thin film.

Therefore, there is a need for a polymer material which allows the viscosity of a polymer solution to be adjusted while keeping low crystallinity. In order to satisfy ouch a need, it is effective to use a polymer material having, for example, a crosslink state and a crosslink dissociation state in which one of the crosslink state and the crosslink dissociation state can be changed into the other state due to an external energy ouch as heat, light, or the like. Such a polymer material includes a crosslinkable functional group in the molecular structure thereof, and crosslinkable sites of the crosslinkable functional group may be cross linked (crosslink state) or may not be cross linked (crosslink dissociation state) depending on, for example, heat or light. As described above, a change between the crosslink state and the crosslink dissociation state may be unidirectional or reversible.

As an example of such a material, a polymer material, which can be reversibly changed by heat from a crosslink state to a crosslink dissociation state or from the crosslink dissociation state to the crosslink state, will be described below.

Figure 1C:
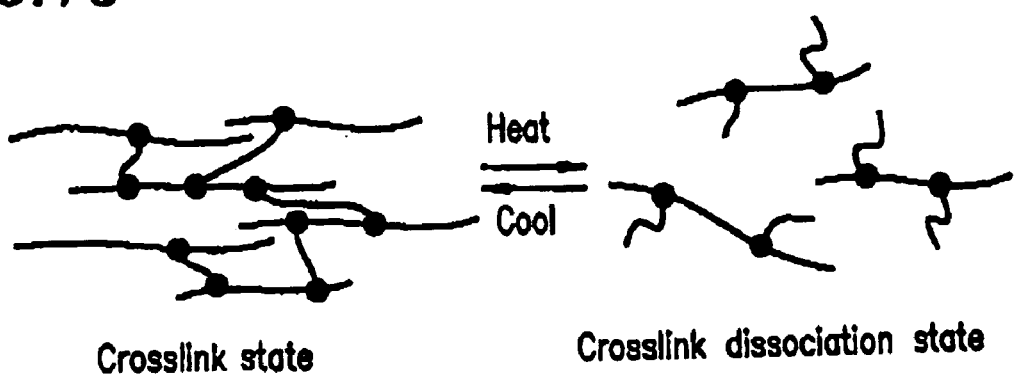
FIG. 1*c* to is a schematic diagram illustrating a polymer material which is brought into a crosslink state at a low temperature and into a crosslink dissociation state at a high temperature according to the present invention.

FIG. 1c in a schematic diagram of a polymer compound which is in a crosslink state at a low temperature (shown on the left in FIG. 1c) and is in a crosslink dissociation state at a high temperature (shown on the right in FIG. 1c). In the schematic diagram of FIG. 1c, although side chains of the molecular chains of the polymer compound are illustrated as if they are crosslinkable sites, the crosslinkable sites may be present at terminuses of the molecular chains. The molecular weight of the polymer compound is great at a low temperature since the polymer compound is in the crosslink state. The molecular weight of the polymer compound is small at a high temperature since the polymer compound is in the crosslink dissociation state. Therefore, in the case of producing a polymer solution by dissolving a polymer material, which includes such a polymer compound, in a solvent, when the polymer solution is cooled, the viscosity thereof is increased, and on the other hand, when the polymer solution is heated, the viscosity thereof is decreased. By utilizing this property so au to decrease the viscosity of the polymer solution by heating the polymer solution at the time of applying the polymer solution on a substrate, it is possible to readily produce a uniform thin film without defects which is on the scale of the order of tons of nanometers. Moreover, after applying the polymer solution on the substrate, by lowering the temperature of the substrate on which the polymer solution is applied, a crosslinkable site of the crosslinkable functional group in the polymer compound is bound to another crosslinkable site so that the polymer compound is brought into a crosslink state, thereby increasing the molecular weight of the polymer compound. In this manner, according to the present invention, it is possible to form a satisfactorily amorphous and uniform thin film without defects which is suitable for an organic thin film element. Note that in an organic thin film element using the above-described polymer material of the present invention, the polymer material included in the organic thin film element is brought into a crosslink dissociation state by raising the temperature of the polymer material, no that the molecular weight of a polymer is reduced, thereby allowing the polymer material to be easily collected. Thus, the polymer material is considered to be suitable for recycling.

Next, the polymer material of the present invention will be described in detail. Note that the polymer material (including the polymer compound) described hereinafter in provided for the purpose of illustrations only, and in any cases, the structure (main chains, side chains, repeating units, etc.), molecular weight, etc., of the polymer material are not limited to any specific examples unless otherwise indicated. For example, when the polymer material is a copolymer, the structure (random, block, grafting, etc.), the molecular weight, the polymerization ratio of monomers, etc., are not limited to any specific examples, and when the polymer material is a polymer bland, the type of each homopolymer, the molecular weight, the blend ratio, etc., are not limited to any specific examples.

Figure 2A:
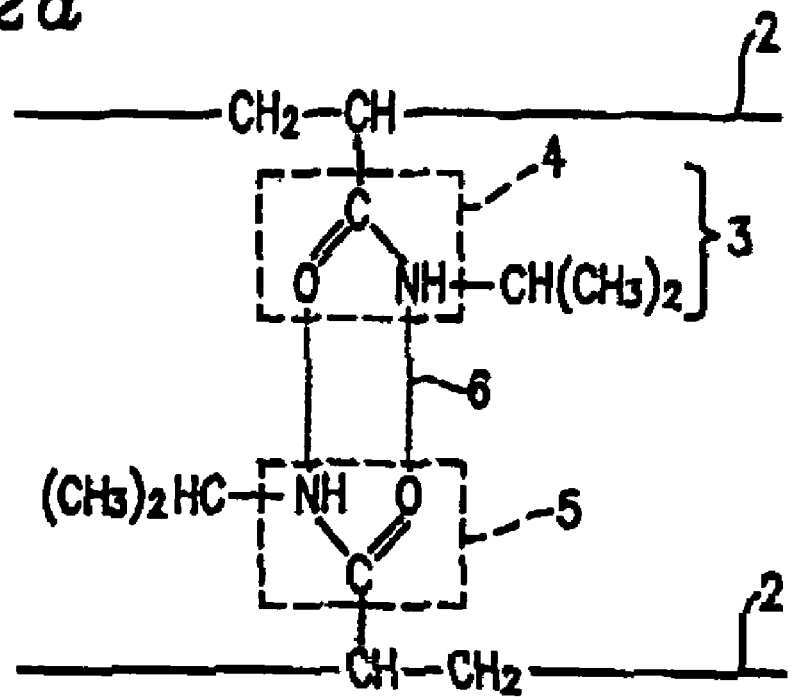
FIG. 2*a* is a diagram illustrating crosslink provided by a hydrogen bond of polymer compounds one of which has an isopropyl amide group as a crosslinkable functional group introduced thereinto.
Figure 2B:
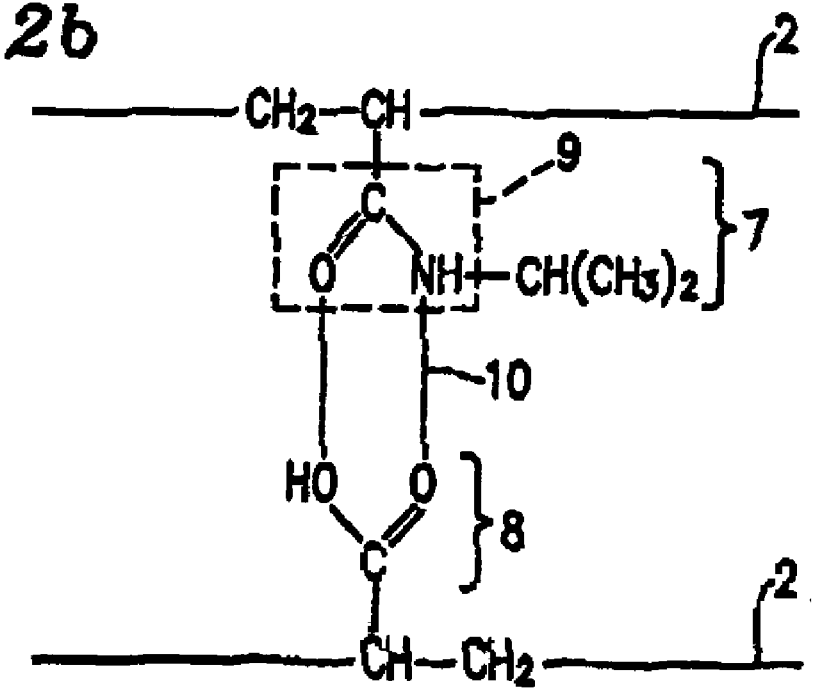
FIG. 2*b* in a diagram illustrating crosslink provided by a hydrogen bond of polymer compounds having an isopropylamide group and a carboxylic group, respectively, an crosslinkable functional groups introduced thereinto.

FIGS. 2a and 2b show examples of polymer compounds having a crosslinkable functional group introduced thereinto.

FIG. 2a is a diagram illustrating crosslink provided by hydrogen bond of polymer compounds one of which has an isopropyl amide group 3 as a crosslinkable functional group introduced thereinto. In FIG. 2a, although the isopropyl amide group 3 is directly bonded to a main chain 2 of the polymer compound, the isopropyl amide group 3 may be bonded to any side chain or terminus of a molecular chain. Crosslink between molecular chains can be achieved by a hydrogen bond 6 formed by an amide group portion 4 of the isopropyl amide group 3 and another amide group portion 5.

FIG. 2b is a diagram illustrating crosslink provided by hydrogen bond of polymer compounds having an isopropyl amide group 7 and a carboxyl group 8, respectively, as crosslinkable functional groups introduced thereinto. In FIG. 2b, although the isopropyl amide group 7 and the carboxyl group 8 are directly bonded to corresponding main chains 2 of the polymer compound, each of the isopropyl amide group 7 and the carboxyl group 8 may be bonded to any side chain or terminus of a molecular chain. Crosslink between molecular chains can be achieved by a hydrogen bond 10 formed by an amide group portion 9 of the isopropyl amide group 7 and the carboxyl group 8. Although not shown in FIG. 2b, the amide group portion 9 of the isopropyl amide group 7 may form crosslink with an amide group portion of another isopropyl amide group or two carboxyl groups may form crosslink therebetween.

In the example described above, a hydrogen bond in used an a bond for forming crosslink between molecular chains. Examples of a functional group, which can form crosslink using such a hydrogen bond, include a hydroxyl group, an amino group, a halogen-containing group (iodine, bromine, chlorine, and fluorine), a base-containing group (adenine-cytosine, and guanine-thymine), etc., in addition to the amide group and the carboxyl group which are described above. Such a functional group can bring a polymer material into a crosslink state by heating or cooling and can also reversibly bring the polymer material into a crosslink dissociation state by cooling or heating. The polymer material of the present invention is only required to be reversibly changed between the crosslink state and the crosslink dissociation state depending on an external energy, and therefore the external energy may be any energy other than heat, e.g., light. Examples of a functional group, which is crosslinked (crosslink state) or is not crosslinked (crosslink dissociation state) depending on light (photocrosslinkable functional group), include aromatic polyfunctional compounds, such as anthracene, phenanthrene, tetracene, and pentacene, complex compounds thereof, or derivative-containing groups thereof. Moreover, the above-described photocrosslinkable functional groups can bring the polymer material into the crosslink state by light and can bring the polymer into the crosslink dissociation state by heat.

Further, according to the present invention, although it is possible to use a polymer compound having a plurality of types of crosslinkable functional groups, at least one type of a functional group may be required.

Furthermore, there may be one type of a polymer compound included in the polymer material of the present invention or may be a plurality of types of polymer compounds mixed together in the polymer material of the present invention.

In the cases shown in FIGS. 2a and 2b, the hydrogen bond is dissociated when the temperature thereof reaches about 65° C. or more. Accordingly, when applying a polymer solution on a substrate, the temperature of the polymer solution in required to be maintained so as to be equal to or more than a temperature at which crosslink dissociation occurs. By maintaining such a temperature, the polymer solution can be readily applied on the substrate using a spincoating method, an inkjet method, or the like.

A solvent having the boiling point, which is too low, is not suitable for use in production of the polymer solution. This is because when the boiling point of the solvent in low, the solvent is evaporated before crosslink between polymer is dissociated. As described above, when using a hydrogen bond for crosslinking, the boiling point of the solvent may be about 65° C. or more, preferably about 80° C. or more. Examples of such a solvent include, but are not limited to, chloroform, dioxane, NMP (n-methylpyrrolidone), γ-butyrolactone, xylene, toluene, etc.

In order to use the above-described polymer compound, which has at least one type of crosslinkable functional group, as a material for an organic thin film element, it is necessary to provide the polymer compound with a carrier transport property (a luminescent property or an electrical charge transport property). In general, there are two types of polymer compounds with which a luminescent property or an electrical charge transport property is provided.

The first type is a pendant-type polymer compound. The pendant-type polymer compound will be described below with reference to FIG. 3.

FIG. 3 is a diagram illustrating polymer compounds 11 and 12 each having a crosslinkable functional group and a luminescent agent or an electrical charge transport agent, which is introduced as a pendant. In FIG. 3, reference numerals 13 and 14 denote crosslinkable functional groups and a pendant site Y represents a luminescent agent, a doping agent, an electrical charge transport agent (an electron transport agent or a hole transport agent), or the like.

Examples of the luminescent agent or doping agent include, but are not limited to, naphthalene, anthracene, phenanthrene, pyrone, tetracene, fluoresceine, perylene, phthaloperylene, naphthaloperylene, perynone, phthaloperynone, naphthaloperynone, diphenylbutadiene, tetraphenyl butadiene, coumarin, quinoline metal complexes, imine, diphenylanthracene, diaminocarbazole, quinacridone, rubrene, derivatives thereof, and the like.

Examples of the hole transport agent include, but are not limited to, a phthalocyanine-based compound, a naphtalocyanine-based compound, a porphyrin-based compound, oxadiazole, triazole, imidazole, tetrahydroimidazole, oxazole, stilbene, butadiene, derivatives thereof, and the like.

Examples of the electron transport agent include, but are not limited to, fluorenone, anthraquinodimethane, diphenoquinone, thiopyrandioxide, oxadiazole, thiadiazole, tetrazole, a perylenetetracarboxylic acid, anthraquinodimethane, anthrone, derivatives thereof, and the like.

The second type is a π-conjugated polymer compound. The π-conjugated polymer compound will be described below with reference to FIG. 4.

FIG. 4 is a diagram illustrating polymer compounds 17 and 18 having crosslinkable functional groups 15 and 16, respectively, and a main chain having a π-conjugated structure. The π-conjugated structure is introduced into each of the main chains of the polymer compounds 17 and 18 so as to provide the polymer compounds 17 and 18 with a luminescent property or an electrical charge transport property.

Examples of the polymer compound having a π-conjugated structure, but are not limited to, polyphenylene vinylene, polythiophene, polyfluorene, derivatives thereof, and the like.

(Synthesis Procedure)

Next, the procedure for synthesizing a polymer compound included in the polymer material of the present invention will be described. Here, the procedure for synthesizing a polymer compound to which triphenylamine as an electrical charge transport agent is introduced as a pendant will be described as an example.

(Procedure 1): Triphenylamine methyl alcohol as a triphenylamine derivative and an acrylic acid chloride were dissolved in benzene, and then the resultant benzene solution was stirred at 0° C. for five hours so as to cause the triphenylamine methyl alcohol to react with the acrylic acid chloride. After the reaction, the benzene solution was evaporated under reduced pressure so as to obtain a triphenylamine methyl acrylate monomer as a crude crystal. Next, the crude crystal was recrystallized by benzene for purification. The reaction scheme of the triphenylamine methyl alcohol and the acrylic acid chloride is shown in Scheme 1.

[Scheme 1]

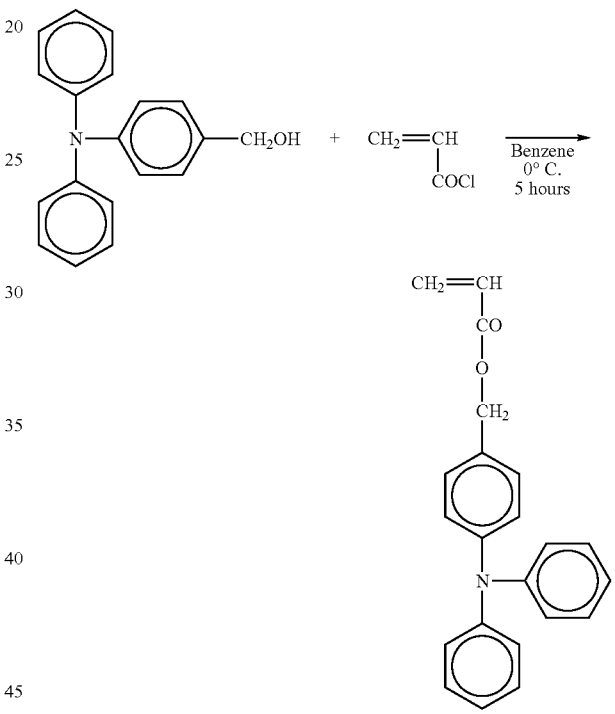

(Procedure 2): The triphenylamine methyl acrylate monomer obtained in Procedure 1 and an N-isopropyl acrylic amide monomer ware dissolved in dioxane, and a small amount of 2,2'-azobisisobutyronitrile (AIBN) was added to the resultant dioxane solution as a polymerization initiator. Radical polymerization was performed on the dioxane solution while maintaining the temperature thereof at 60° C. and stirring it for twelve hours. After the completion of the polymerization, the dioxane solution was dropped into ether, which is a poor solvent, so that created polymer precipitated in the solvent. Moreover, in order to remove an unreacted monomer or a low molecular weight polymer, which was present in the precipitated created polymer, after the precipitated created polymer was collected, the created polymer was dissolved in methanol, which is a good solvent, and other was used as a poor solvent for further purification. The molecular weight (Mw) of the polymer compound obtained in this manner, which was measured by gel permeation chromatography (GPC) measurement, was 50,000 (relative to polystyrene standards).

The reaction scheme of radical polymerization between the triphenylamine methyl acrylate monomer and the N-isopropyl acrylic amide monomer is shown in Scheme 2.

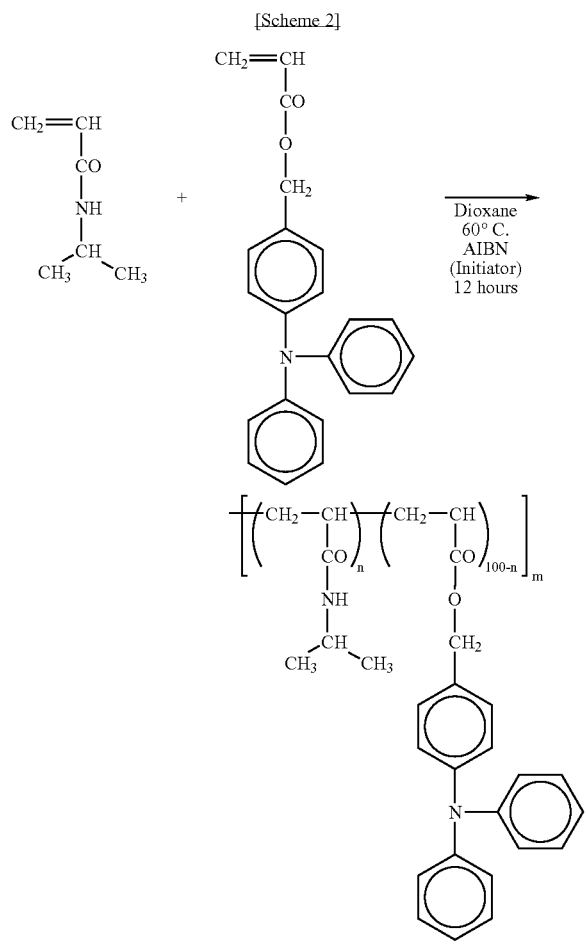

[Scheme 2]

Next, a method for producing an organic thin film element according to the present invention will be described.

Figure 5:
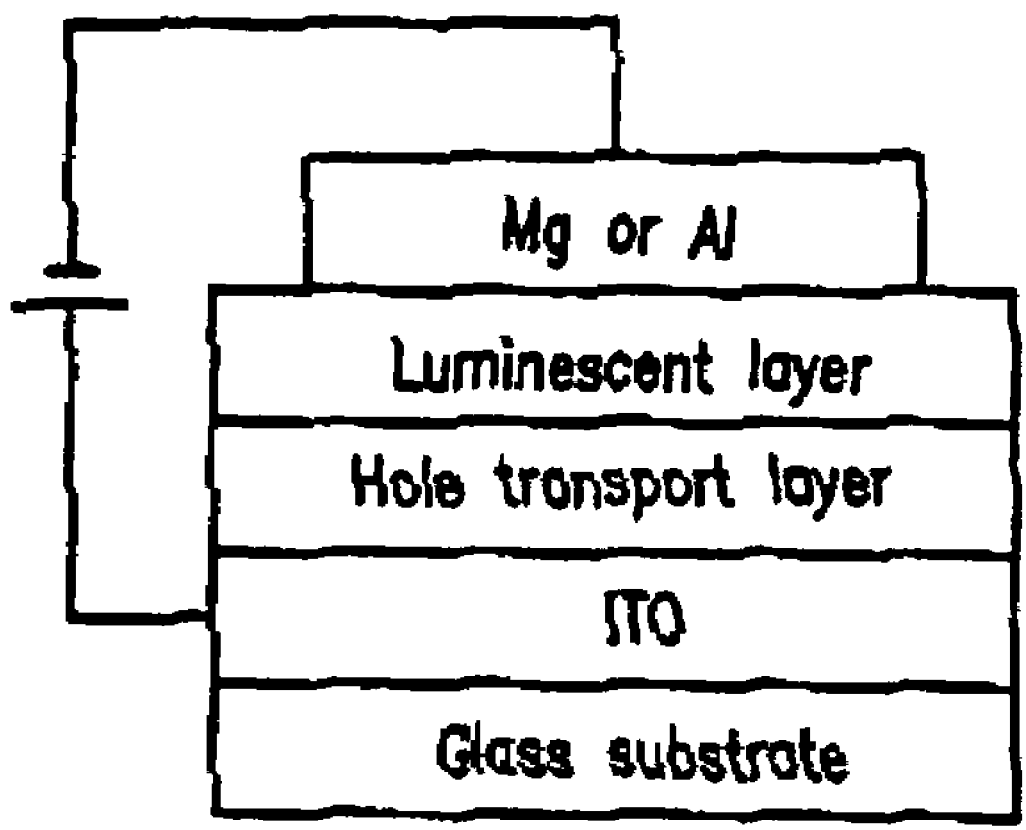
FIG. 5 is a schematic diagram illustrating a structure of an organic thin film element using a polymer material of the present invention.

FIG. 5 is a schematic diagram illustrating the structure of an organic thin film element using a polymer material of the present invention. The organic thin film element of FIG. 5 can be produced according to the following steps of:

(1) dissolving the polymer material of the present invention in a solvent so as to prepare a polymer solution;

(2) adjusting an external energy (heat, light, or the like) provided to the polymer solution prepared in step (1) so as to bring the polymer material in the solution into a crosslink dissociation state;

(3) applying the solution of the polymer material, which is in the crosslink dissociation state, on a substrate;

(4) burning the substrate on which the polymer solution is applied so as to form an organic thin film; and (5) adjusting the external energy to change the state of the polymer material included in the organic thin film from the crosslink dissociation state to a crosslink state.

Next, an organic thin film element, an electronic device, and conductor lines according to the present invention will be described in details in the following examples.

EXAMPLE 1

In the present example, an organic thin film element was produced using a polymer material including a polymer compound which has a crosslinkable functional group and a luminescent agent or an electrical charge transport agent introduced an a pendant. Specifically, the organic thin film element was produced so as to have a two-layer structure in which a thin film (luminescent layer) of a polymer compound, which has a crosslinkable functional group and a luminescent agent introduced as a pendant, and a thin film (hole transport layer) of a polymer compound, which has a crosslinkable functional group and a hole transport agent introduced as a pendant, are sandwiched between two pieces of electrodes (positive and negative electrodes) one of which is transparent. The production procedure will be described below.

Figure 6A:
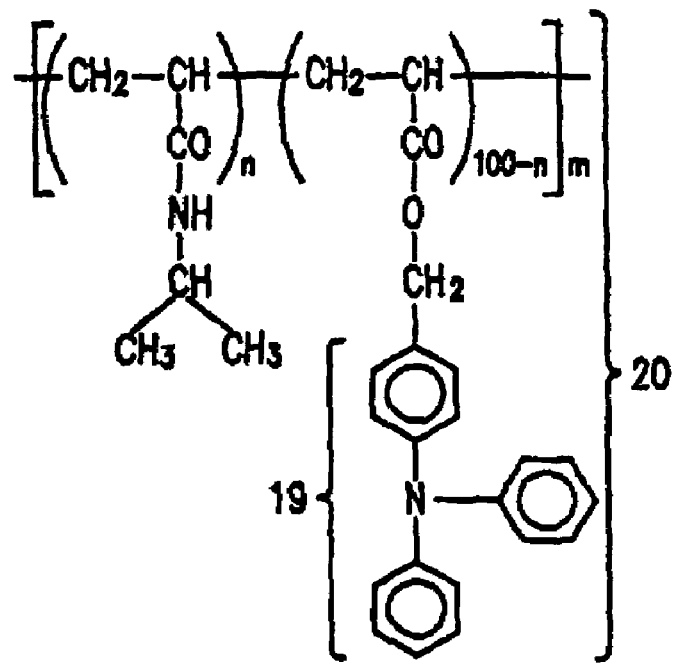
FIG. 6*a* in a diagram illustrating a polymer compound having a triphenylamine derivative introduced as a pendant and a crosslinkable functional group.

(Procedure 1): In order to form the hole transport layer (injection layer), a xylene solution of a polymer compound 20 shown in FIG. 6a, which has a crosslinkable functional group and a triphenylamine derivative 19 introduced as a pendant, was applied on a glass substrate on which an indium tin oxide (ITO) was patterned under a temperature condition of about 50° C. using a spincoating method. The reason for setting the temperature at about 50° C. is that the viscosity of the polymer solution is high at a temperature lower than about 50° C., and therefore the application by a spincoating method cannot be performed. Next, the substrate on which the polymer solution was applied was burned in a vacuum at about 200° C. for about one hour so as to evaporate xylene. In this case, the thickness of the hole transport layer formed on the substrate was about 100 nm.

Figure 6B:
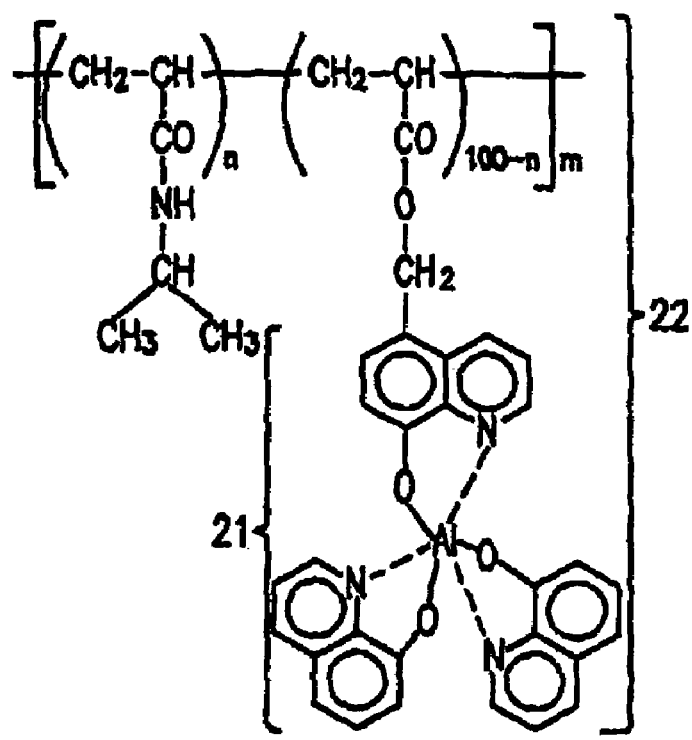
FIG. 6*b* in a diagram illustrating a polymer compound having an aluminum-quinoline complex ($Alq_3$), which is a green luminescent material introduced an a pendant, and crosslinkable functional group.

(Procedure 2): Next, in order to form the luminescent layer, a xylene solution of a polymer compound 22 shown in FIG. 6b, which has a crosslinkable functional group and an aluminum-quinoline complex ($Alq_3$) 21 which is a green luminescent material introduced as a pendant, was applied on the substrate under a temperature condition of about 60° C. using a spincoating method. The reason for setting the temperature at about 60° C. is that the viscosity of the polymer solution is high at a temperature lower than about 60° C., and therefore the application by a spincoating method cannot be performed. Next, the substrate on which the polymer solution was applied was burned in a vacuum at about 200° C. for about one hour so as to evaporate xylene. In this case, the thickness of the luminescent layer formed on the substrate was about 50 nm.

A luminescence test was conducted by applying a prescribed voltage to the two-layer structure organic thin film element produced according to Procedures 1 and 2. An a result, the brightness of about 1000 $cd/m^2$ was achieved as initial brightness. The application of the prescribed voltage to the organic thin film element was further sequentially conducted. It took about 2000 hours or more before the brightness was reduced by half. In thin manner, in the organic thin film element according to Example 1, the obtained luminescence can be stable for a long period of time.

COMPARATIVE EXAMPLE 1

Figure 6C:
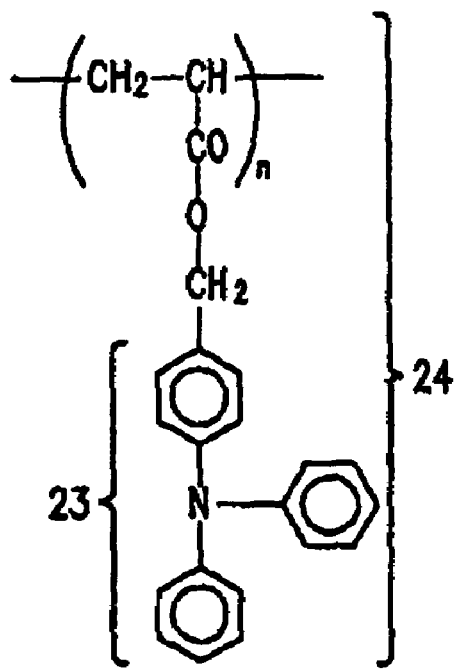
FIG. 6*c* is a diagram illustrating a polymer compound having a triphenylamine derivative as a hole transport agent, which in introduced as a pendant, and no crosslinkable functional group.
Figure 6D:
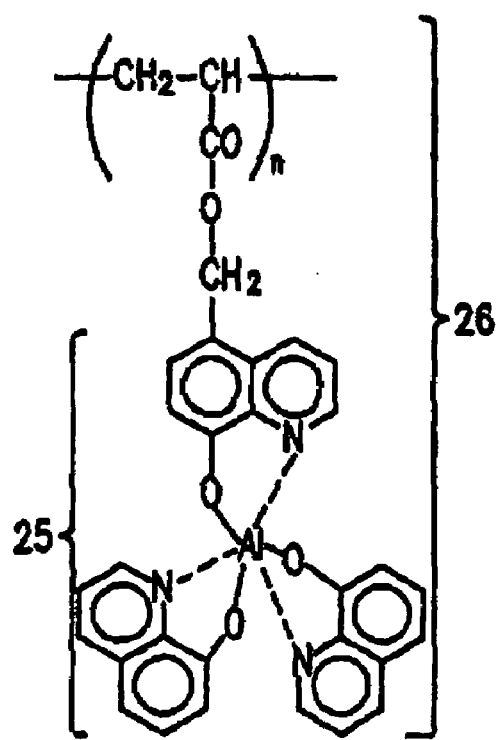
FIG. 6*d* is a diagram illustrating a polymer compound having $Alq_3$ as a luminescent agent, which in introduced as a pendant, and no crosslinkable functional group.

As a comparative example of Example 1, an organic thin film element was produced using a polymer material including a polymer compound which has no crosslinkable functional group and a luminescent agent or an electrical charge transport agent introduced as a pendant, and a luminescence test was performed on the produced organic thin film element. In Comparative Example 1, conditions and procedure for producing the organic thin film element and conditions of the luminescence test are the same as those of Example 1, except that the polymer compound of Comparative Example 1 does not have a crosslinkable functional group and spincoating is conducted at room temperature. As the polymer compounds used in Comparative Example 1, a polymer compound 24, which has a triphenylamine derivative 23 as a hole transport agent introduced as a pendent but does not have a crosslinkable functional group, is shown in FIG. 6c, and a polymer compound 24, which has Alq$_3$ 25 as a luminescent agent introduced an a pendant but does not have a crosslinkable functional group, is shown in FIG. 6d.

Similar to Example 1, the luminescence test was conducted, so that the brightness of 800 cd/m$^2$ was achieved as initial brightness. The application of the prescribed voltage to the organic thin film element was further sequentially conducted. It took 1200 hours before the brightness was reduced by half.

From the results of Example 1 and Comparative Example 1, it is appreciated that when molecules in a polymer compound having a luminescent agent or an electrical charge agent introduced an a pendant are crosslinked to each other, a polymer material including the polymer compound can be maintained in a stable amorphous state, so that a high-brightness and long-life organic thin film element can be obtained.

EXAMPLE 2

In the present example, an organic thin film element was produced using a polymer material including a polymer compound which has a crosslinkable functional group and a main chain having a π-conjugated structure. Specifically, the organic thin film element was produced so as to have a two-layer structure in which a thin film (luminescent layer) of a polymer compound, which has a π-conjugated structure in a main chain thereof and a crosslinkable functional group, and a thin film (hole transport layer) of a polymer compound, which has a π-conjugated structure in a main chain thereof and a crosslinkable functional group, are sandwiched between two pieces of electrodes (positive and negative electrodes) one of which is transparent. The production procedure will be described below.

(Procedure 1): In order to form the hole transport layer (injection layer), a xylene solution of a polymer compound 28 shown in FIG. 7a, which has a polythiophene as a main chain and a crosslinkable functional group 27, was applied on a glass substrate on which ITO was patterned under a temperature condition of about 50° C. using a spincoating method. The reason for setting the temperature at about 50° C. is because the viscosity of the polymer solution is high at a temperature lower than about 50° C., and therefore the application by a spincoating method cannot be performed. Next, the substrate on which the polymer solution was applied was burned in a vacuum at about 200° C. for about one hour so an to evaporate xylene. In this case, the thickness of the hole transport layer formed on the substrate was about 100 nm.

(Procedure 2): Next, in order to form the luminescent layer, a xylene solution of a polymer compound 30 shown in FIG. 7b, which has a polyoctylfluorene as a main chain and a crosslinkable functional group 29, wan applied on the substrate under a temperature condition of about 60° C. using a spincoating method. The reason for setting the temperature at about 60° C. is that the viscosity of the polymer solution is high at a temperature lower than about 60° C., and therefore the application by a spincoating method cannot be performed. Next, the substrate on which the polymer solution was applied was burned in a vacuum at about 200° C. for about one hour so as to evaporate xylene. In this case, the thickness of the luminescent layer formed is on the substrate was about 50 nm.

A luminescence test was conducted by applying a prescribed voltage to the two-layer structure organic thin film element produced according to Procedures 1 and 2. As a result, the brightness of about 700 cd/m$^2$ was achieved an initial brightness. The application of the prescribed voltage to the organic thin film element was further sequentially conducted. It took about 2000 hours or more before the brightness was reduced by half. In this manner, in the organic thin film element according to Example 2, the obtained luminescence can be stable for a long period of time.

COMPARATIVE EXAMPLE 2

Figure 7A:
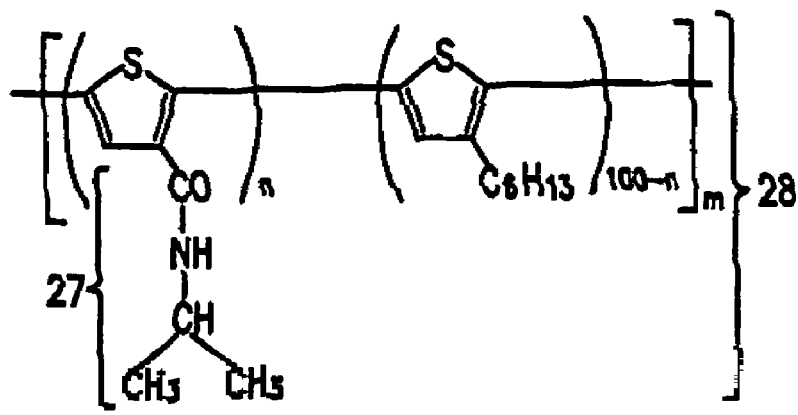
FIG. 7*a* in a diagram illustrating a polymer compound having polythiophene, which provides a hole transport property, an a main chain and a crosslinkable functional group.

As a comparative example of Example 2, an organic thin film element was produced using a polymer material including a polymer compound, which has no crosslinkable functional group and a main chain having a π-conjugated structure, and a luminescence test was performed on the produced organic thin film element. In Comparative Example 2, conditions and procedure for producing the organic thin film element and conditions of the luminescence test is the same as those of Example 2, except that the polymer compound of Comparative Example 2 does not have a crosslinkable functional group and spincoating is conducted at room temperature. As with the polymer compounds used in Comparative Example 2, a polymer compound 31 having a polythiophene, which provides a hole transport property, as a main chain and no crosslinkable functional group is shown in FIG. 7c, and a polymer compound 32 having a polyoctylfluorene, which provides a luminescent property, as a main chain and no crosslinkable functional group is shown in FIG. 7d.

Similar to Example 2, the luminescence test was conducted, so that the brightness of 300 cd/m$^2$ was achieved as initial brightness. The application of the prescribed voltage to the organic thin film element was further sequentially conducted. It took 1400 hours before the brightness was reduced by half.

From the results of Example 2 and Comparative Example 2 it is appreciated that when molecules in a polymer compound having a π-conjugated structure which provides a luminescent property or an electrical charge transport property, are crosslinked to each other, a polymer material including the polymer compound can be maintained in a stable amorphous state, so that a high-brightness and long-life organic thin film element can be obtained.

Figure 7B:
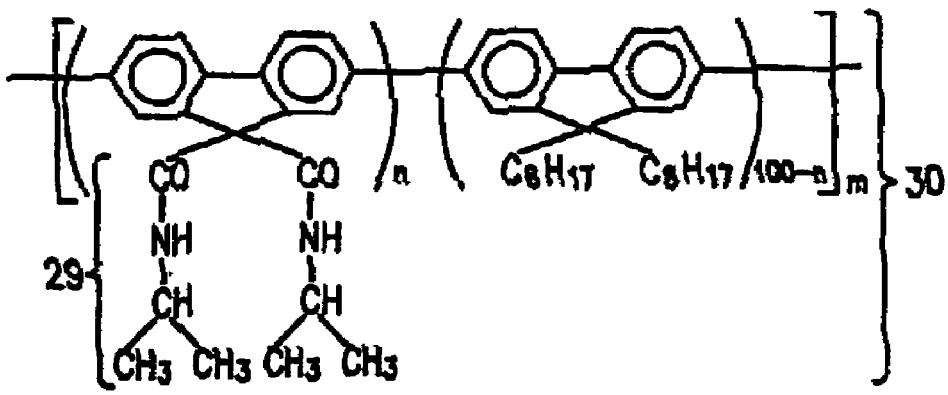
FIG. 7*b* is a diagram illustrating a polymer compound having polyoctylfluorene, which provides a luminescent property, as a main chain and a crosslinkable functional group.
Figure 7C:
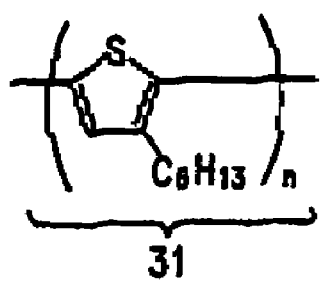
FIG. 7*c* is a diagram illustrating a polymer compound having polythiophene, which provides a hole transport property, as a main chain and no crosslinkable functional group.
Figure 7D:
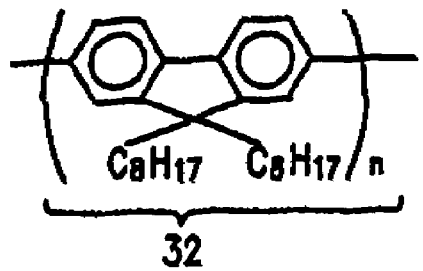
FIG. 7*d* in a diagram illustrating a polymer compound having polyoctylfluorene, which provides a luminescent property, an a main chain and no crosslinkable functional group.
Figure 7E:
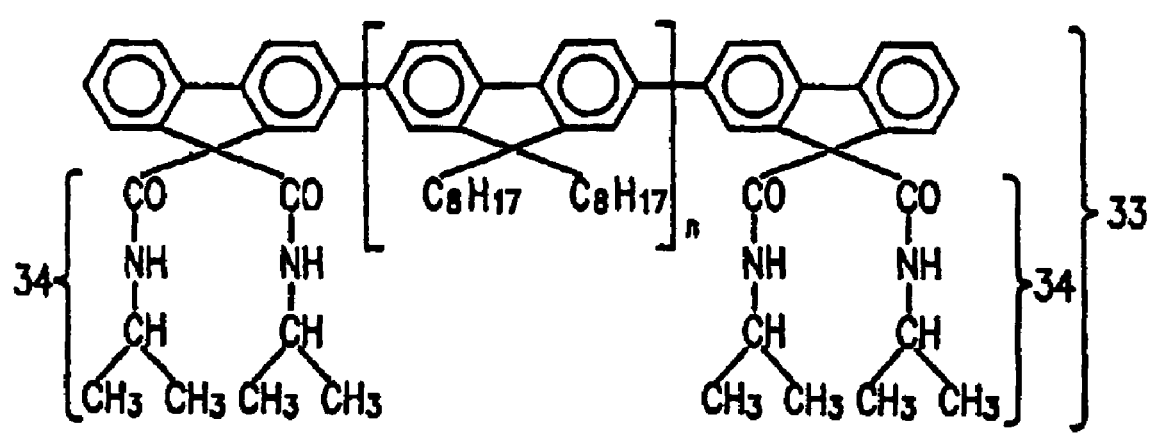
FIG. 7*e* is a diagram illustrating a polymer compound having polyoctylfluorene, which provides a luminescent property, as a main chain and a crosslinkable functional group, which in provided at a terminus of a polymer chain.

As shown in FIG. 7b, the crosslinkable functional group 29 included in the polymer compound 30, which has polyoctylfluorene as a main chain, used in Example 2 can be crosslinked to side chains. However, the polymer compound of the present invention is not limited to such a structure, and may have crosslinkable functional groups 34 at terminuses of polymer chains, an in the ease of a polymer compound 33 shown in FIG. 7e.

The application of the polymer material having a carrier transport property according to the present invention has been described using the examples of the organic thin film element. However, in addition to the organic thin film element, the present invention can be applied to, for example, an electronic device element, such as an organic TFT element, an organic solar cell, a switching element, a rectifying element, or the like, and conductor lines.

Next, as examples of the electronic device element, the organic TFT element and the conductor lines will be described in the following examples.

EXAMPLE 3

FIG. 8 is a diagram illustrating the steps of producing an organic TFT element using a polymer material having a carrier transport property of the present invention.

In the organic TFT element shown in FIG. 8, the polymer compound 30 shown in FIG. 7b, which has polyoctylfluorene as a main chain and the crosslinkable functional group 29, is used as an electrode material. A high temperature treatment causes fluorene to acquire an orientational property. This facilitates the flow of carriers through fluorene, thereby increasing conductivity of the polymer compound 30. Moreover, in the polymer compound 30 used as the electrode material, a hydrogen bond causes the crosslinkable functional group 29 to form crosslink. The hydrogen bond is introduced into the polymer compound 30 in the most efficient manner, and the crosslink between molecules maintains the orientational property of fluorene for a long period of time, thereby prolonging the life of electrodes.

Further, the polymer compound 28 shown in FIG. 7a, which has polythiophene an a main chain and the crosslinkable functional group 27, in used as an organic semiconductor layer. A rubbing treatment causes the organic semiconductor layer to acquire an orientational property. Then, the crosslinkable functional group 27 of the polymer compound 28 included in the organic semiconductor layer is crosslinked by a hydrogen bond, whereby the orientational property of the organic semiconductor layer is fixed, no that a stable organic semiconductor layer can be obtained.

Note that in a structure of each element of an organic TFT element array in the present example, a gate is placed in the lower part of the organic TFT element array. Scanning lines and signal lines of the organic TFT element array are formed in a gate conductor line process and a source-drain conductor line process, respectively. In the present example, a dopant is added to polymers so as to increase the electroconductive property of the polymers. In addition to a polystyrene sulfonate (PSS), which will be used in a step described later, examples of the types of the dopant include: alkaline metals (e.g., Li, Na, K, Cs, etc.), alkali ammonium ions (e.g. tetraethylammonium, tetrabutylammonium, etc.), and the like, which are used an donor dopants; halogens (e.g., $Br_2$, $I_2$, $Cl_2$, etc.), Lewis acids (e.g., $BF_2$, $PF_5$, $AsF_5$, $BF_4$, $PF_6$, $AsF_6$, etc.), proton acids (e.g., $HNO_3$, $H_2SO_4$, HF, HCl, etc.), transition metal halides (e.g., $FeCl_3$, $MoCl_5$, $WCl_5$, $SnCl_4$, $MoF_5$, $RuF_5$, etc.), and the like, which are used as acceptor dopants; and porphyrins, amino acids, surface active agents, much as alkylsulfonate salts, and the like, which are used as other types of dopants. However, the present invention is not limited to these dopants.

The steps of producing the organic TFT element using a polymer material having a carrier transport property of the present invention will be described in detail below with reference to FIG. 8.

(Step 1): A xylene solution of the polymer compound 30 shown in FIG. 7b to which PSS wan added as a dopant and which has a polyoctylfluorene as a main chain and a crosslinkable functional group 29 was spray-applied on a glass substrate 35 at about 60° C. using an inkjet method. It is preferable that the spray-application by the inkjet method in performed at a high temperature of about 60° C. or more. The application at a temperature lower than about 60° C. is not preferable since the viscosity of the polymer solution is high at such a temperature and it is difficult to perform the application by the inkjet method. Next, the glass substrate 35 on which the polymer solution was applied was burned in a vacuum under a temperature condition of about 280° C. for one hour so as to evaporate xylene and form a gate electrode 36. In this came, the polymer compound 30 included in the formed gate electrode 36 expresses an orientational property due to a high temperature treatment during the burning process.

(Step 2): A γ-butyrolactone solution of polyimide (PI) was applied on the glass substrate 35 on which the late electrode 36 was formed at a room temperature using a spincoating method. Next, the glass substrate 35 on which the solution was applied was burned at about 180° C. for one hour so as to evaporate a solvent and form a gate insulating film 37. In this case, the thickness of the gate insulating film 37 was about 50 nm. Moreover, in order to increase the orientational property of an organic semiconductor layer which will be formed later, a rubbing treatment was performed on the surface of the gate insulating film 37.

(Step 3): After forming an indium tin oxide (ITO) thin film 38 at regions on the gate insulating film 37 so as not to overlap with the gate electrode 36, a xylene solution of the polymer compound 30 shown in FIG. 7b to which PSS was added as a dopant and which has polyoctylfluorene as a main chain and the crosslinkable functional group 29 was spray-applied on the glass substrate 35 at about 60° C. using an inkjet method. Similar to the above-described Step 1, it is preferable that the spray-application by the inkjet method is performed at a temperature of about 60° C. or more. Next, the glass substrate 35 on which the polymer compound solution was applied was burned in a vacuum under a temperature condition of about 280° C. for one hour, so as to evaporate xylene and form a source-drain electrode 39. In this case, the polymer compound 30 included in the formed source-drain electrode 39 expresses an orientational property due to the high temperature treatment during a burning process.

(Step 4): A xylene solution of the polymer compound 28 shown in FIG. 7a, which has polythiophene as a main chain and the crosslinkable functional group 27, was applied on the glass substrate 35 on which the source-drain electrode 39 was formed at a temperature of about 50° C. using a spincoating method. It is preferable that the application by the spincoating method is performed at a temperature of about 50° C. or more. The application at a temperature lower than about 50° C. is not preferable since the viscosity of the polymer solution is high at such a temperature and it is difficult to perform the application by the spincoating method. Next, the glass substrate 35 on which the polymer solution was applied was burned in a vacuum under a temperature condition of about 200° C. for one hour so as to evaporate xylene and form an organic semiconductor layer 40. In this case, the thickness of the organic semiconductor layer 40 was about 100 nm.

In the organic TFT element produced according to the above-described Steps 1-4, a coefficient of membrane resistance of the electrode material was measured and a measurement value of about 40 μΩ/cm was obtained. This measurement value is substantially at the same level as that of a molybdenum-tantalum alloy (Mo—Ta) which has been conventionally used as an electrode material. Carrier mobility of the organic semiconductor layer, which represents a carrier transport property, was 1 cm$^2$/Vs. This value is substantially at the same level as that of amorphous silicon, which has been conventionally used an a material for an organic semiconductor layer.

As described above, in the organic TFT element using a polymer material having a carrier transport property of the present invention, the polymer material has a functional group, which can be linked by a hydrogen bond, and the hydrogen bond is introduced into the polymer material in the most efficient manner. Therefore, it is possible to produce an element having performance at a similar level to that of a TFT element which uses conventional amorphous silicon.

Note that it is preferable that an organic semiconductor layer is formed on a gate insulating layer to which a rubbing treatment is performed and a polymer material included in the semiconductor layer in crosslinked by a hydrogen bond so as to fix an orientational property thereof, since the carrier mobility thereof in considerably improved.

EXAMPLE 4

Figure 9A:
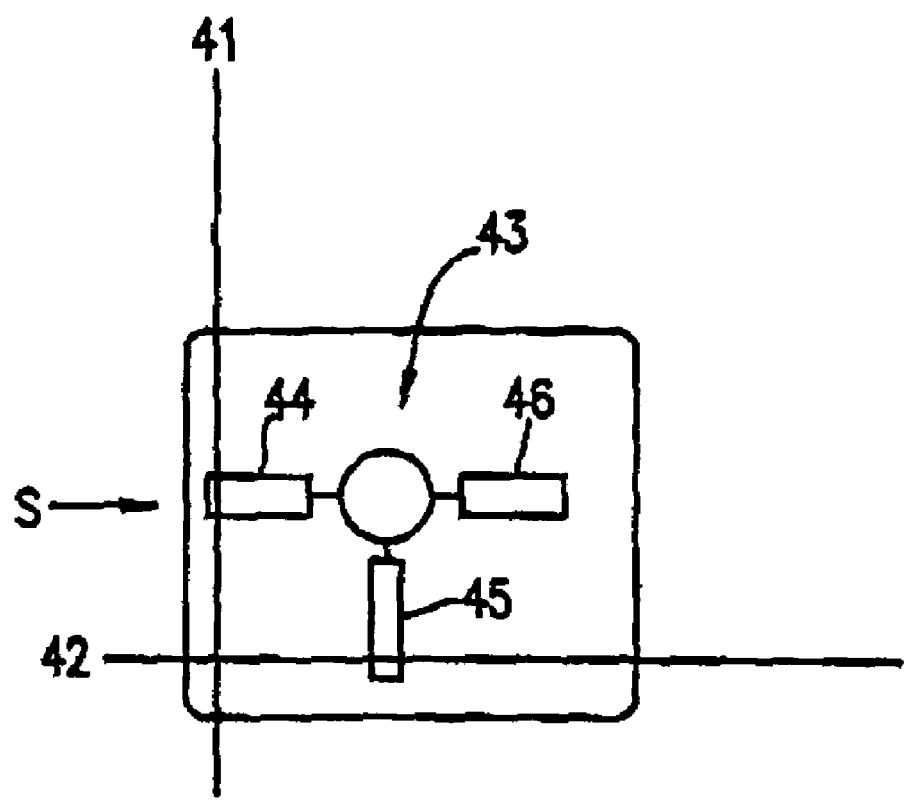
FIG. 9*a* is a schematic diagram illustrating conductor line in a molecular single electron transistor (MOSES), which use a polymer material having a carrier transport property of the prevent invention.
Figure 9B:
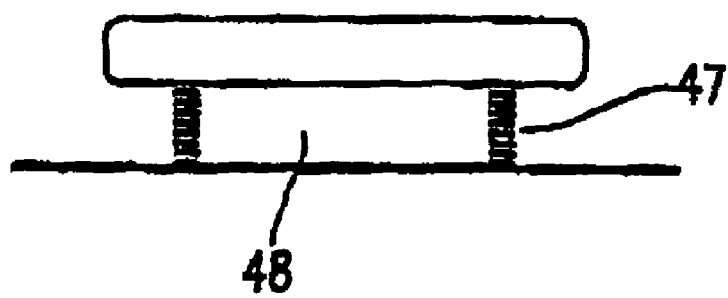
FIG. 9*b* is a schematic diagram illustrating a side of a source electrode viewed from the S direction shown in FIG. 9*a*.

FIG. 9a to a schematic diagram illustrating conductor lines of a molecular single electron transistor (MOSES) 43 which uses a polymer material having a carrier transport property of the present invention. FIG. 9b is a schematic view illustrating a side of a source molecule 44 when viewing the MOSES 43 from the S direction shown in FIG. 9a.

In the present example, effects of a hydrogen bond of a polymer material were simulated in designing of the conductor lines of the MOSES 43 using the polymer material having a carrier transport property of the present invention. Note that a conventional transistor was used as the MOSES 43 (see "KOGYO ZAIRYOU (Industrial material)", June, 2002, Vol. 50, No. 6, pp. 22-250). As shown in FIG. 9a, in the MOSES 43, the source molecule 44 is connected to a scanning line 41 and a gate molecule 45 is connected to a signal line 42. A material for the scanning line 41 and the signal line 42 is the polymer compound 30 shown in FIG. 7b which has polyoctylfluorene as a main chain and the crosslinkable functional group 29.

In the MOSES 43 of the present example, two hydrogen bond residues 47 are attached to each of the source molecule 44 and the gate molecule 45. A hydrogen bond residue may or may not be attached to a drain molecule 46. Further, overlap of π-electron clouds (π-π interaction) 48 in present between each conductor line portion and transistor portions (the source molecule 44 and the gate molecule 45), and therefore carriers flow from each conductor line to the transistor. In the present example, the hydrogen bond residue 47 of the MOSES 43 creates a hydrogen bond to a crosslinkable functional group of the polymer material included in the scanning line 41 and the signal line 42, and therefore the π-π interaction 48 in stabilized, so that carrier injection from each conductor line to the MOSES 43 occurs efficiently.

For the purpose of comparison, a similar simulation was performed on a MOSES (not shown) in which no hydrogen bond residue is attached to a source molecule and a gate molecule. The MOSES having no hydrogen bond residue cannot form a hydrogen bond to the scanning line and the signal line, and therefore π-π interaction is unstabilized, so that efficiency of carrier injection from each conductor line to the MOSES is reduced.

The above-described crosslink due to a hydrogen bond can be brought into a crosslink dissociation state by increasing the temperature of the polymer material to about 80° C. or more. By utilizing such a property in the case where the MOSES is used for a liquid crystal display element in conjunction with conductor lines which use the polymer material of the present invention, it is possible to prevent liquid crystal materials from being deteriorated. The liquid crystal display element has a problem that when a voltage is applied to a liquid crystal material at a high temperature, deterioration of the liquid crystal material is accelerated, thereby considerably shortening the life of the liquid crystal display element. However, in the case of using the conductor lines including the polymer material of the present invention, by raising the temperature of the polymer material to about 80° C., a hydrogen bond between the conductor lines and the MOSES are brought into a crosslink dissociation state, and therefore the flow of carriers from each conductor line to the MOSES is decreased, whereby it is possible to suppress voltage application to the liquid crystal material. In this manner, the deterioration of the liquid crystal material is prevented.

As described above, it is very efficient in the use of an electronic device element (in particular, a liquid crystal display element) to use crosslink and crosslink dissociation states due to a hydrogen bond so as to enable bonding between each conductor line and a transistor to be reversibly controlled.

INDUSTRIAL APPLICABILITY

The polymer material having a carrier transport property of the present invention has the first and second states in which the degrees of the carrier transport property are different. Microscopic structures in the first and second states are different from each other and one of the first and second states can be changed into the other state. These characteristics allow selection of a state, which represents more preferable physical properties of the polymer material, according to conditions, such as a production condition, a processing condition, etc., at the time. Accordingly, the polymer material of the present invention can be easily handled and a product using the polymer material of the present invention can be of high quality as compared to conventional products. Moreover, when the change between the first and second states of the polymer material of the present invention is reversible, the polymer material has an effect of being suitable for recycling.

Further, in the case of using the polymer material of the present invention, the problem of easy crystallization, which has been conventionally seen in low molecular materials, in not caused, whereby it in possible to obtain a satisfactorily amorphous and high quality thin film. Such a thin film has high transparency, and therefore can be used as a luminescent element for a long period of time. Accordingly, the polymer material of the present invention is suitable as a material for an organic thin film element.

Furthermore, in the method for producing an organic thin film element using the polymer material of the present invention, since the polymer material of the present invention allows polymer chains to be brought into a crosslink state or a crosslink dissociation state by an external energy (heat, light, or the like), by suitably adjusting the external energy such that a crosslinkable site of a crosslinkable functional group is brought into a crosslink dissociation state during a film formation process, it is possible to prevent the viscosity of a polymer solution from being increased. Accordingly, it is possible to stably form a thin film on the scale of tens of nanometers which has a uniform thickness and no defects using a general-purpose method such an a spincoating method or an inkjet method.

Further still, in the electronic device element using the polymer material of the present invention, the polymer material has a functional group which can be crosslinked by a hydrogen bond and the hydrogen bond is introduced into a polymer compound included in the polymer material in the most efficient manner. Accordingly, it is possible to produce an element having performance at a similar level to that of a TFT element using conventional amorphous silicon. In case of producing, in particular, an organic TFT element as the electronic device element, it is more efficient to form an organic semiconductor layer on a gate insulating layer on which a rubbing treatment is performed and bring a polymer material included in the semiconductor layer into a crosslink state by a hydrogen bond so as to fix an orientational property of the polymer material, since carrier mobility of the semiconductor layer is drastically increased.

Further still, in the conductor lines using the polymer material of the present invention, since the polymer material can be brought into a crosslink state at a low temperature and into a crosslink dissociation state at a high temperature, by utilizing such a property in the case where the conductor lines are used in a liquid crystal display element, it is possible to prevent the problem of deterioration of a liquid crystal material (in particular, a liquid crystal display element) to use a hydrogen bond so as to reversibly control bonding between a conductor line and the liquid crystal display element.

The invention claimed is:

1. A polymer material having a carrier transport property, comprising at least one type of a crosslinkable functional group, wherein the polymer material has first and second states in which degrees of the carrier transport property are different from each other, microscopic structures in the first and second states are different from each other, and one of the first and second states can be changed into the other state, wherein the change is reversible, and wherein, in the first state, the crosslinkable functional group is in a crosslink dissociation state, and in the second state, the crosslinkable functional group is in a crosslink state, wherein in the crosslink state, the crosslinkable functional groups or the terminuses of the polymer are bonded in a chemical bonding state, and in the crosslink dissociation state, the crosslinkable functional groups or the terminuses of the polymer are not bonded or associated.

2. A polymer material according to claim 1, wherein the change occurs depending on an external energy.

3. A polymer material according to claim 2, wherein the external energy is heat or light.

4. A polymer material according to claim 1, wherein the crosslinkable functional group is an amide group, a carboxyl group, a hydroxyl group, an amino group, a halogen-containing group, a base-containing group, or an aromatic polyfunctional compound or a complex compound thereof or a derivative-containing group thereof.

5. A polymer material according to claim 1, wherein the carrier transport property in expressed by introduction of a pendant.

6. A polymer material according to claim 1, wherein the carrier transport property is expressed by introduction of a $\pi$-conjugated structure.

7. A polymer material according to claim 1, comprising one or more types of polymer compounds.

8. An organic thin film element comprising a polymer material of claim 1.

9. A method for producing an organic thin film element using a polymer material of claim 1, the method comprising the steps of: dissolving the polymer material in a solvent so as to prepare a solution; adjusting an external energy so as to bring the polymer material in the solution into a crosslink dissociation state; applying the solution, which includes the polymer material in the crosslink dissociation state, on a substrate; burning a substrate on which the solution is applied so as to form an organic thin film; and adjusting the external energy so as to change the polymer material included in the organic thin film from the crosslink dissociation state to a crosslink state.

10. A method according to claim 9, wherein the change from one of the crosslink state and the crosslink dissociation state to the other state is reversible.

11. A method according to claim 9, wherein the external energy is heat or light.

12. A method according to claim 9, wherein the crosslinkable functional group is an amide group, a carboxyl group, a hydroxyl group, an amino group, a halogen-containing group, a base-containing group, or an aromatic polyfunctional compound or a complex compound thereof or a derivative-containing group thereof.

13. A method according to claim 9, wherein the carrier transport property is expressed by introducing a pendant into the polymer material.

14. A method according to claim 9, wherein the carrier transport property in expressed by introducing a $\pi$-conjugated structure into the polymer material.

15. A method according to claim 9, wherein the polymer material comprises one or more types of polymer compounds.

16. An electronic device element comprising a polymer material of claim 1.

17. A conductor line comprising a polymer material of claim 1.

* * * * *